(12) United States Patent
Huang et al.

(10) Patent No.: US 12,453,133 B2
(45) Date of Patent: Oct. 21, 2025

(54) TRANSISTOR STRUCTURE AND METHOD OF FORMING THE SAME

(71) Applicant: Taiwan Semiconductor Manufacturing Company, Ltd., Hsinchu (TW)

(72) Inventors: Chien-Hao Huang, Hsinchu (TW); Gao-Ming Wu, New Taipei (TW); Katherine H Chiang, New Taipei (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 658 days.

(21) Appl. No.: 17/901,843

(22) Filed: Sep. 1, 2022

(65) Prior Publication Data

US 2024/0079497 A1    Mar. 7, 2024

(51) Int. Cl.
*H10D 30/67* (2025.01)
*H10D 30/01* (2025.01)
*H10D 62/13* (2025.01)

(52) U.S. Cl.
CPC ....... *H10D 30/6755* (2025.01); *H10D 30/031* (2025.01); *H10D 30/6757* (2025.01); *H10D 62/151* (2025.01)

(58) Field of Classification Search
CPC ............. H10D 30/6755; H10D 30/031; H10D 30/6757; H10D 62/151; H10D 86/423; H10D 86/60; H10D 86/451
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 * | 9/2014 | Wang | H01L 21/76831 257/745 |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2022/0376075 A1* | 11/2022 | Manfrini | H10B 53/30 |

* cited by examiner

*Primary Examiner* — Fernando L Toledo
*Assistant Examiner* — Shawn Shaw Muslim
(74) *Attorney, Agent, or Firm* — JCIPRNET

(57) ABSTRACT

Provided are a transistor structure and a method of forming the same. The transistor structure includes a gate electrode; a gate dielectric layer, disposed on the gate electrode; an active layer, disposed on the gate dielectric layer; a pair of source/drain (S/D) features, disposed on the active layer; and an isolation structure, laterally surrounding the pair of S/D features, wherein the isolation structure at least comprises a blocking layer and an upper dielectric layer on the blocking layer.

20 Claims, 22 Drawing Sheets

TRANSISTOR STRUCTURE AND METHOD OF FORMING THE SAME

BACKGROUND

The semiconductor industry has grown due to continuous improvements in integration density of various electronic components (e.g., transistors, diodes, resistors, inductors, capacitors, etc.). For the most part, these improvements in integration density have come from successive reductions in minimum feature size, which allow more components to be integrated into a given area. In this regard, individual transistors, interconnects, and related structures have become increasingly smaller and there is an ongoing need to develop new materials, processes, and designs of semiconductor devices and interconnects to allow further progress.

Thin-film transistors made of oxide semiconductors are an attractive option for back-end-of-line (BEOL) integration since thin-film transistors may be processed at low temperatures and thus, may not damage previously fabricated devices. For example, the fabrication conditions and techniques may not damage previously fabricated front-end-of-line (FEOL) and middle end-of-line (MEOL) devices. Circuits based on thin-film transistor devices may further include other components that may be fabricated in a BEOL process, such as capacitors, inductors, resistors, and integrated passive devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
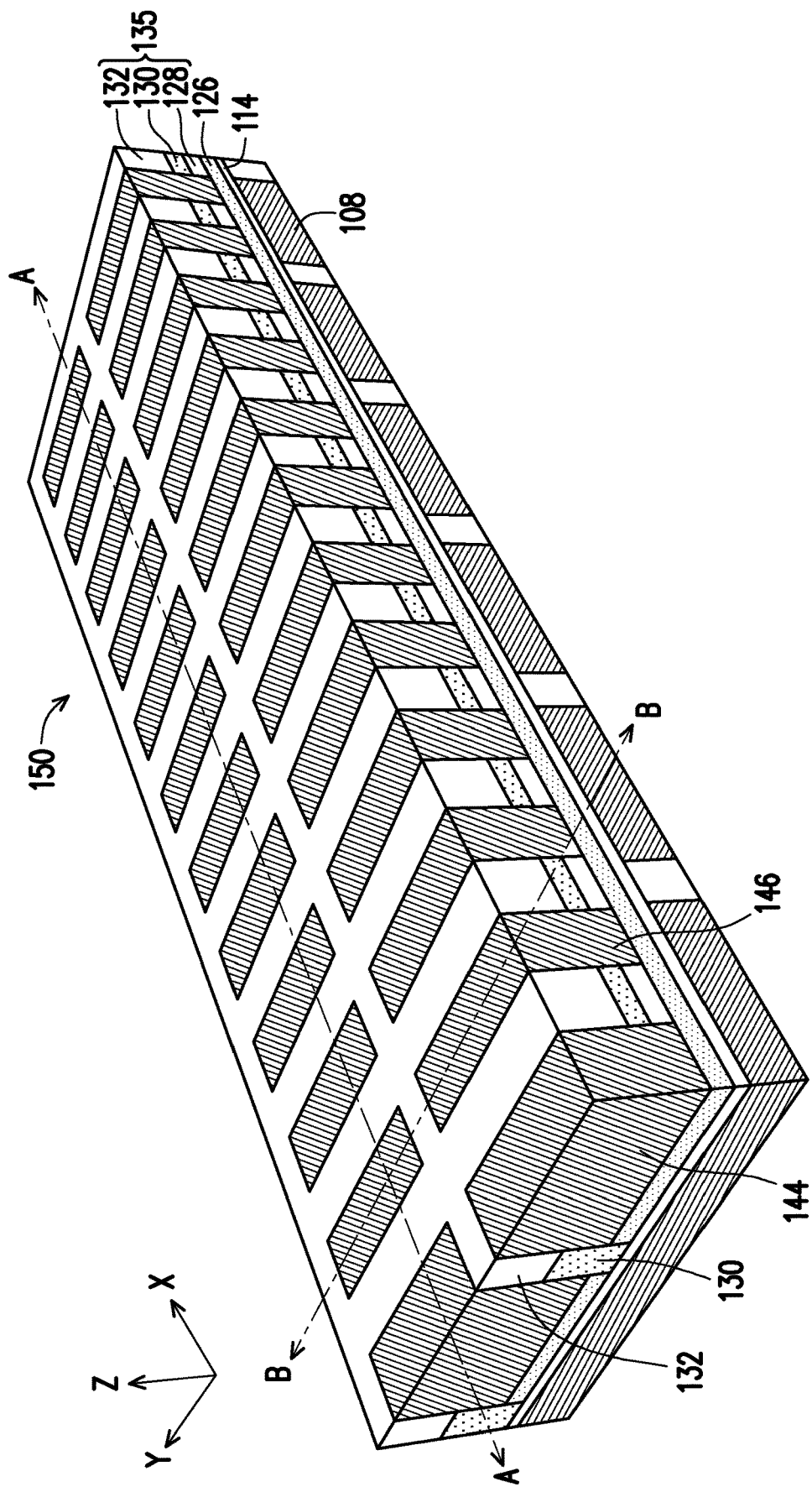
FIG. 1 is a perspective view showing a transistor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2A:
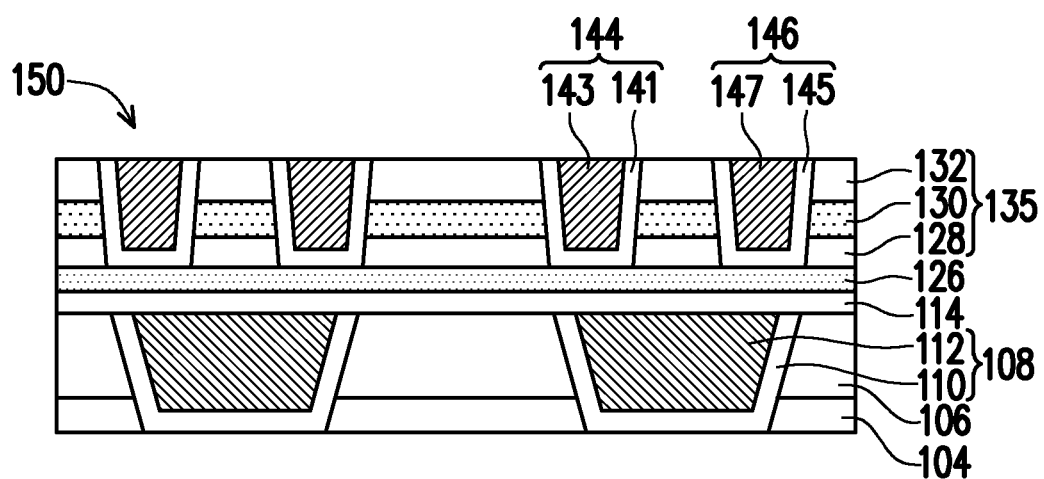
FIG. 2A is a cross-sectional view of a transistor structure in FIG. 1 taken along the line A-A in accordance with some embodiments.
Figure 2B:
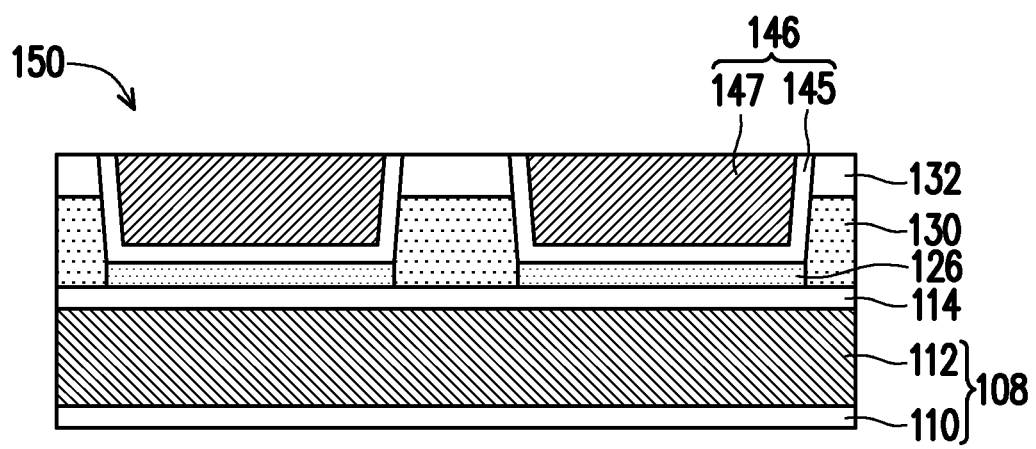
FIG. 2B is a cross-sectional view of a transistor structure in FIG. 1 taken along the line B-B in accordance with some embodiments.

FIG. 1 is a perspective view showing a transistor structure in accordance with some embodiments. FIG. 2A is a cross-sectional view of a transistor structure in FIG. 1 taken along the line A-A in accordance with some embodiments. FIG. 2B is a cross-sectional view of a transistor structure in FIG. 1 taken along the line B-B in accordance with some embodiments. According to some embodiments of the disclosure, the transistor structure (e.g., a thin-film transistor) is provided that may be formed in a BEOL process and may be incorporated with other BEOL circuit components such as capacitors, inductors, resistors, and integrated passive devices. As such, the disclosed transistor structure may include materials that may be processed at low temperatures (e.g., less than 350° C.) and thus, may not damage previously fabricated devices (e.g., FEOL and MEOL devices).

Referring to FIG. 1, FIG. 2A, and FIG. 2B, provided is a transistor structure 150 including a gate electrode 108, a gate dielectric layer 114, an active layer 126, a pair of source/drain (S/D) features 144, 146, and an isolation structure 135. In the present embodiment, the transistor structure 150 may be referred to as a thin-film transistor (TFT).

In detail, the gate electrode 108 is embedded in an etch stop layer 104 and a dielectric layer 106, as shown in FIG. 2A. In some embodiments, the gate electrode 108 includes a metallic liner layer 110 and a metallic fill layer 112 on the metallic liner layer 110. The metallic liner layer 110 may include a conductive metallic nitride or a conductive metallic carbide such as TiN, TiN/W, Ti/Al/Ti, TaN, WN, TiC, TaC, and/or WC. The metallic fill layer 112 may include W, Cu, Al, Co, Ru, Mo, Ta, Ti, TiN, alloys thereof, and/or combinations thereof. Other suitable metallic liner and metallic fill materials within the contemplated scope of this disclosure may also be used.

The gate dielectric layer 114 may be disposed on the gate electrode 108. In some embodiments, the gate dielectric layer 114 covers a top surface of the gate electrode 108 and the dielectric layer 106. The gate dielectric layer 114 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. Other suitable dielectric materials are within the contemplated scope of disclosure. In other embodiments, the gate dielectric layer 114 may include an alternating multi-layer structure including silicon oxide and silicon nitride.

The active layer 126 may be disposed on the gate dielectric layer 114. In some embodiments, the active layer 126 includes a semiconductor material such as an oxide semiconductor material. The oxide semiconductor material may include InGaZnO, InGaO, InWO, InZnO, InSnO, ZnO, GaO, InO, and alloys thereof. Other suitable semiconducting materials (e.g., amorphous silicon) are within the contemplated scope of disclosure. For example, in various embodiments, the active layer 126 may include a composition given by $In_x Ga_y Zn_z MO$, wherein $0<x<1$; $0<y<1$; $0<z<1$; and M is one of Ti, Al, Ag, Ce, and Sn.

The pair of S/D features 144 and 146 may be disposed on the active layer 126. In some embodiments, one S/D feature 144 may be referred to as a source electrode, while the other S/D feature 146 may be referred to as a drain electrode, and vice versa. The S/D feature 144 may include a metallic liner layer 141 and a metallic fill layer 143 on the metallic liner layer 141. The S/D feature 146 may include a metallic liner layer 145 and a metallic fill layer 147 on the metallic liner layer 145. The metallic liner layers 141 and 145 may include a conductive metallic nitride or a conductive metallic carbide such as TiN, TiN/W, Ti/Al/Ti, TaN, WN, TiC, TaC, and/or WC. The metallic fill layers 143 and 147 may include W, Cu, Al, Co, Ru, Mo, Ta, Ti, TiN, alloys thereof, and/or combinations thereof. Other suitable metallic liner and metallic fill materials within the contemplated scope of this disclosure may also be used.

The isolation structure 135 may laterally surround the pair of S/D features 144 and 146. In some embodiments, the pair of S/D features 144 and 146 is embedded in the isolation structure 135. In a cross-sectional view along a X direction, the isolation structure 135 may include a lower dielectric layer 128, an upper dielectric layer 132, and a blocking layer 130 vertically sandwiched between the lower dielectric layer 128 and the upper dielectric layer 132, as shown in FIG. 2A. In a cross-sectional view along a Y direction, the blocking layer 130 further extends to cover a sidewall of the active layer 126 and is in physical contact with a top surface of the gate dielectric layer 114, as shown in FIG. 2B.

In some embodiments, the lower dielectric layer 128 and the upper dielectric layer 132 include silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the lower dielectric layer 128 and the upper dielectric layer 132 include low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the lower dielectric layer 128 and the upper dielectric layer 132 each includes one or more dielectric materials. The lower dielectric layer 128 and the upper dielectric layer 132 may have the same dielectric material or different dielectric materials.

In some embodiments, the blocking layer 130 includes a high-k dielectric material which has a dielectric constant greater than 3.9 or greater than silicon oxide. The blocking layer 130 may include aluminum oxide, silicon oxide carbide, chromium oxide ($Cr_2O_3$), or a combination thereof. In the present embodiment, the material of the blocking layer 130 is different from the material of the lower dielectric layer 128 and the upper dielectric layer 132. More specifically, the blocking layer 130 has a dielectric constant greater than a dielectric constant of the lower dielectric layer 128 and the upper dielectric layer 132. For example, the blocking layer 130 is the aluminum oxide layer, and the lower dielectric layer 128 and the upper dielectric layer 132 are the silicon oxide layers. It should be noted that the blocking layer 130 can protect the surface of the active layer 126 from the diffusion of unwanted elements/molecules (e.g., O, N, H, $H_2O$, or the like) into the active layer 126 resulting from subsequent deposition or etching processes. The unwanted elements/molecules would change the carrier concentration of the active layer 126, thereby affecting the electrical performance and device reliability. That is, in the present embodiment, the blocking layer 130 is able to stabilize the carrier concentration of the active layer 126, thereby maintaining the electrical performance and further improving the device reliability of the transistor structure 150.

The steps of forming the transistor structure 150 will be described in detail in the following paragraphs.

FIG. 3A, FIG. 4A, FIG. 5A, FIG. 6A, FIG. 7A, FIG. 8A, FIG. 9A, and FIG. 10A are cross-sectional views of forming a semiconductor device with the transistor structure in FIG. 1 taken along the line A-A in accordance with a first embodiment. FIG. 3B, FIG. 4B, FIG. 5B, FIG. 6B, FIG. 7B, FIG. 8B, FIG. 9B, and FIG. 10B are cross-sectional views of forming a semiconductor device with the transistor structure in FIG. 1 taken along the line B-B in accordance with a first embodiment.

Figure 3A:
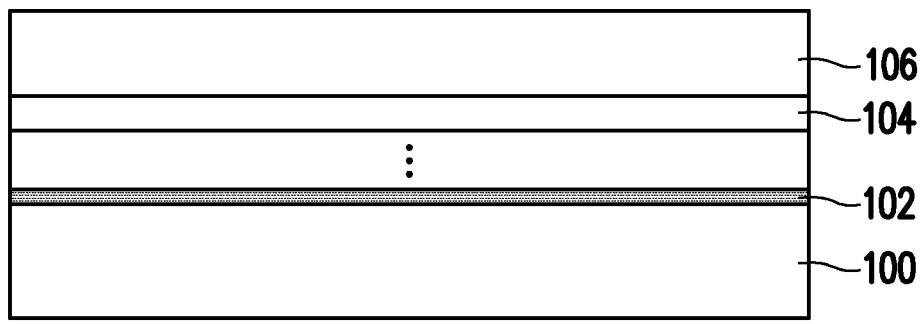
FIG. 3A, FIG. 4A, FIG. 5A, FIG. 6A, FIG. 7A, FIG. 8A, FIG. 9A, and FIG. 10A are cross-sectional views of forming a semiconductor device with the transistor structure in FIG. 1 taken along the line A-A in accordance with a first embodiment.
Figure 3B:
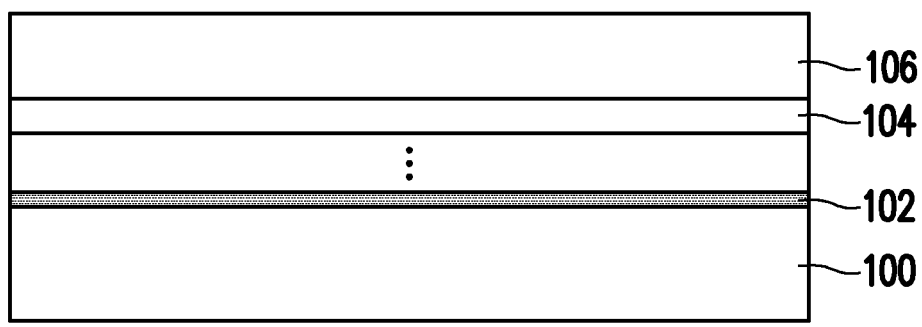
FIG. 3B, FIG. 4B, FIG. 5B, FIG. 6B, FIG. 7B, FIG. 8B, FIG. 9B, and FIG. 10B are cross-sectional views of forming a semiconductor device with the transistor structure in FIG. 1 taken along the line B-B in accordance with a first embodiment.

Referring to FIG. 3A and FIG. 3B, a substrate 100 is provided. In some embodiments, the substrate 100 is a semiconductor substrate, such as a bulk semiconductor, a semiconductor-on-insulator (SOI) substrate, or the like. The substrate 100 may be doped (e.g., with a p-type or an n-type dopant) or undoped. The substrate 100 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

A device region 102 is formed on the substrate 100 in a front-end-of-line (FEOL) process. The device region 102 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 102 includes a gate structure, source and drain regions, and isolation structures such as shallow trench isolation (STI) structures (not shown). In the device region 102, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 100. The functions of the devices may include memory, processors, sensors, amplifiers, power distribution, input/output circuitry, or the like.

An etch stop layer 104 may be formed the device region 102. In some embodiments, the etch stop layer 104 may be a single-layered structure or a multi-layered structure, such as a bi-layered structure, a tri-layered structure, or a four-layered structure etc. The material of the etch stop layer 104 may include silicon oxide, silicon nitride, silicon carbon nitride (SiCN), silicon carbon oxide (SiCO), silicon carbide (SiC), metal oxide (e.g., AlOx, TiOx, ZnOx, MnOx etc.), metal nitride (e.g., AlNx), metal oxynitride (e.g., AlOxNy, TiOxNy etc.) or a combination thereof. The etch stop layer 104 may be formed to a suitable thickness by plasma enhanced chemical vapor deposition (PECVD), plasma enhanced atomic layer deposition (PEALD), thermal ALD, physical vapor deposition (PVD), the like, or a combination thereof.

A dielectric layer 106 is formed on the etch stop layer 104, so that the etch stop layer 104 is disposed between the device region 102 and the dielectric layer 106. In some embodiments, the dielectric layer 106 may be a low-k dielectric layer which has a dielectric constant less than 3.9. For example, the dielectric constant of the dielectric layer 106 ranges from 2.6 to 3.8, such as 2.7, 2.8, 2.9, 3.0, 3.1, 3.2, 3.3, 3.4, 3.5, 3.6, or 3.7, including any range between any two of the preceding values. In some embodiments, the dielectric layer 106 includes a porous dielectric material. In some embodiments, the dielectric layer 106 includes elements such as Si, O, C, N and/or H. For example, the dielectric layer 106 includes SiOCH, SiOC, SiOCN or a combination thereof. In some embodiments, the dielectric layer 106 includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. The dielectric layer 106 may include one or more dielectric materials and/or one or more dielectric layers. The dielectric layer 106 may be formed to a suitable thickness by PECVD, PEALD, spin coating, the like, or a combination thereof.

In some embodiments, one or more interconnect structures (shown as ellipsis) are disposed between the device region 102 and the etch stop layer 104. The one or more interconnect structures may include one or more etch stop layers, one or more dielectric layers, and metal routings embedded in the etch stop layers and dielectric layers (not shown). The metal routings may provide the electrical connection between the device region 102 and to-be-formed gate electrode 108. Alternatively, the one or more interconnect structures may be omitted, so that the etch stop layer 104 is in direct contact the device region 102.

Figure 4A:
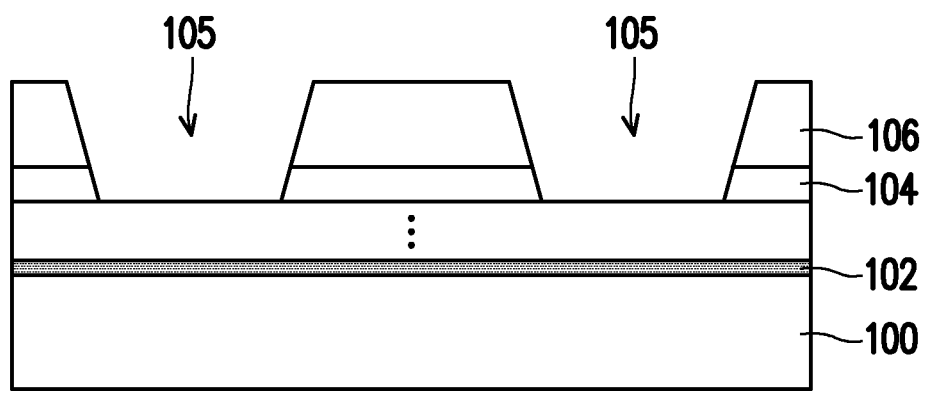
Figure 4B:
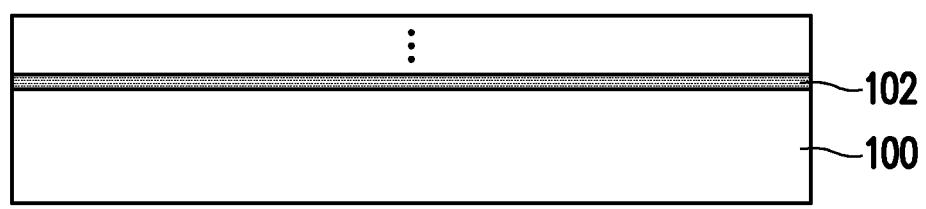

Referring to FIG. 4A and FIG. 4B, a plurality of openings 105 are formed in the etch stop layer 104 and the dielectric layer 106. In some embodiments, the openings 105 are formed by forming a mask pattern on the dielectric layer 106 and performing an etching process by using the mask pattern as mask to remove portions of the dielectric layer 106 and the etch stop layer 104. In some embodiments, the etching process includes a dry etching process, such as a reactive ion etching (RIE) process. As shown in FIG. 4A, the opening 105 may have an inclined sidewall. However, the embodiments of the present disclosure are not limited thereto. In other embodiments, the opening 105 may have a straight sidewall, a stepped sidewall, or any shaped sidewall.

Figure 5A:
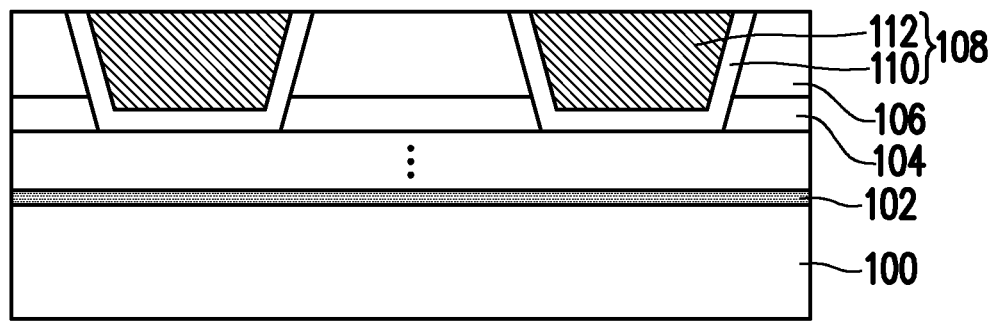
Figure 5B:
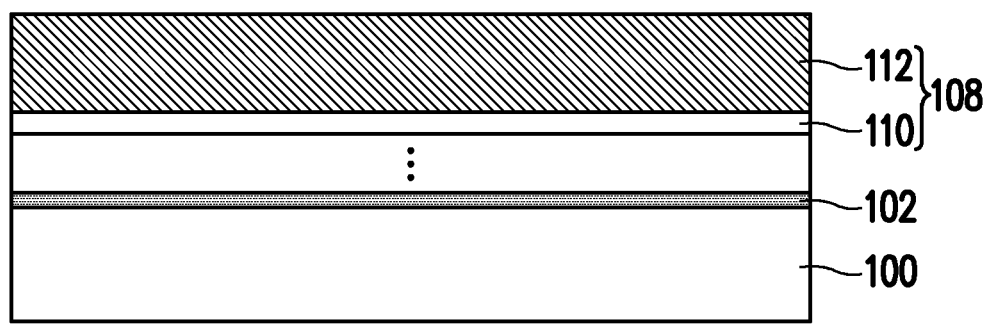

Referring to FIG. 5A and FIG. 5B, a plurality of gate electrodes 108 are respectively formed in the openings 105 (FIG. 4A). In detail, a metallic liner material may be formed to conformally cover the surface of the openings 105 and further extends to cover the top surface of the dielectric layer 106. Next, a metallic fill material may be formed on the metallic liner material and fills in the openings 105. Afterwards, a planarization process may be performed to remove excess portions of the metallic fill material and the metallic liner material on the top surface of the dielectric layer 106, thereby forming the gate electrodes 108 (including a metallic liner layer 110 and a metallic fill layer 112) in the openings 105. After the planarization process, the top surface of the dielectric layer 106 may be substantially level with the top surface of the gate electrodes 108.

In some embodiments, the metallic liner material may include a conductive metallic nitride or a conductive metallic carbide such as TiN, TiN/W, Ti/Al/Ti, TaN, WN, TiC, TaC, and/or WC. The metallic fill material may include W, Cu, Al, Co, Ru, Mo, Ta, Ti, TiN, alloys thereof, and/or combinations thereof. Other suitable metallic liner and metallic fill materials within the contemplated scope of this disclosure may also be used. The metallic liner material and metallic fill material may be formed by suitable deposition process, such as a CVD process, a PVD process, an ALD process, an electroplating process, etc. Other suitable deposition processes are within the contemplated scope of disclosure. Excess portions of the metallic fill material and the metallic liner material may be removed from above a horizontal plane including the top surface of the dielectric layer 106 by the planarization process. The planarization process may include a chemical mechanical polishing (CMP) process although other suitable planarization processes may be used.

Figure 6A:
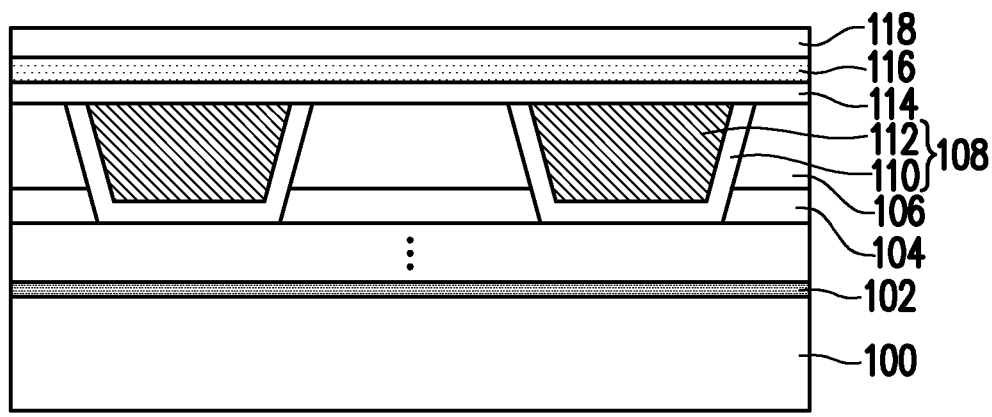
Figure 6B:
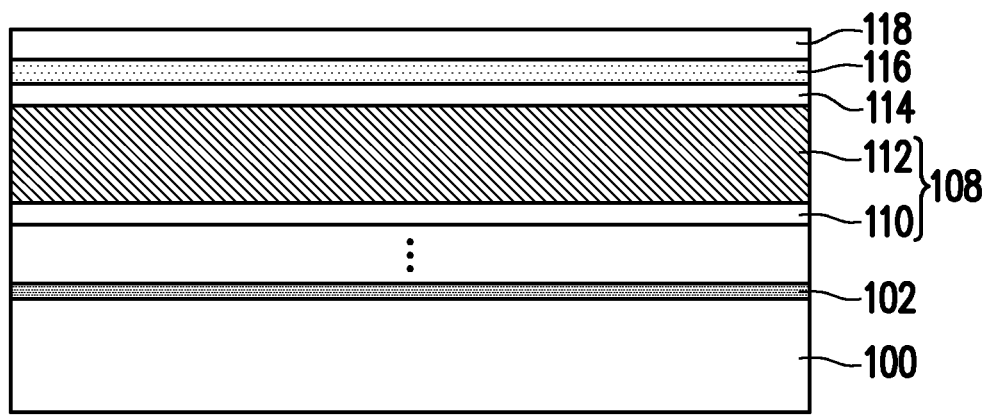

Referring to FIG. 6A and FIG. 6B, a gate dielectric layer 114, a channel material layer 116, and a cap material layer 118 are sequentially formed on the gate electrodes 108. The channel material layer 116 may be formed between the gate dielectric layer 114 and the cap material layer 118. In some embodiments, the gate dielectric layer 114 completely covers the top surface of the gate electrodes 108 and the top surface of the dielectric layer 106. The gate dielectric layer 114 may include, but is not limited to, silicon dioxide, silicon nitride, silicon oxynitride, hafnium oxide, hafnium silicon oxide, hafnium tantalum oxide, hafnium titanium oxide, hafnium zirconium oxide, zirconium oxide, titanium oxide, aluminum oxide, hafnium dioxide-alumina, or various other insulating structures such as a multi-layer stack structure including alternating insulating layers. Other suitable dielectric materials are within the contemplated scope of disclosure. In other embodiments, the gate dielectric layer 114 may include an alternating multi-layer structure including silicon oxide and silicon nitride. In other embodiments, the gate dielectric layer 114 may include a ferroelectric material, as described in greater detail below. The gate dielectric layer 114 may be formed to a suitable thickness by PECVD, PEALD, PVD, the like, or a combination thereof.

Figure 7A:
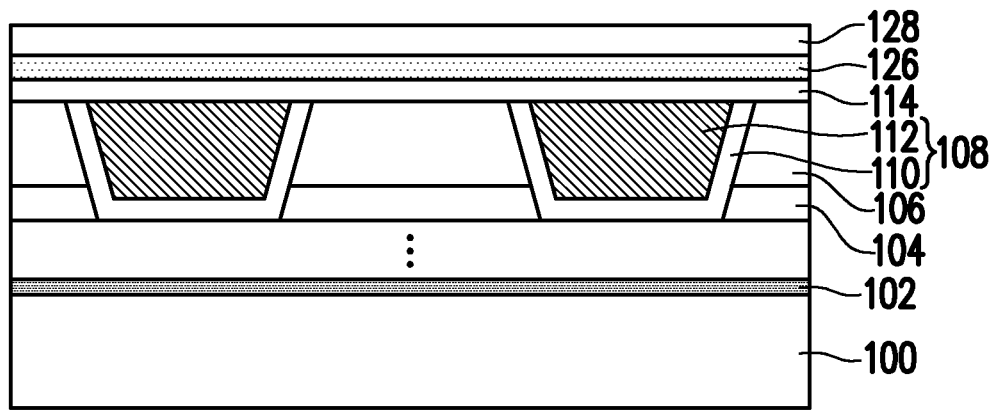
Figure 7B:
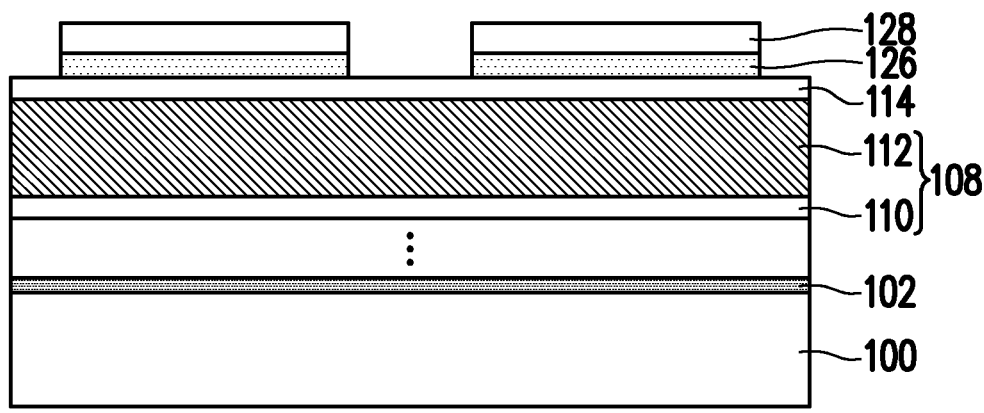

In some alternative embodiments, the gate dielectric layer 114 may include a ferroelectric (FE) material. As such, with the inclusion of a ferroelectric material for the gate dielectric layer 114, the transistor structure 150 may be configured as a ferroelectric field-effect transistor (FeFET) structure. FeFETs are emerging devices, in which a FE layer is utilized as the gate dielectric layer 114 between the gate electrode 108 and to-be-formed channel layer 126 (FIG. 7A). A permanent electrical field polarization in the FE layer causes this type of device to retain the transistor's state (on or off) in the absence of any electrical bias.

A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The electrical polarization is dependent not only on the external electrical field at the time of measurement, but also on the history of the external electrical field, and thus, has a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field.

In embodiments where the gate dielectric layer 114 includes a ferroelectric material, the ferroelectric material may include, but may not be limited to a hafnium oxide-based ferroelectric material, such as $Hf_xZr_{1-x}O_y$, where $0 \leq x \leq 1$ (e.g., $Hf_{0.5}Zr_{0.5}O_2$), $HfO_2$, HfSiO, HfLaO, etc. In various embodiments, the gate dielectric layer 114 may include hafnium zirconium oxide ($H_2O$) doped with elements with smaller ion radius or elements with larger ion radius, in order to enhance ferroelectric polarization. The elements with smaller ion radius may include Al or Si, while the elements with larger ion radius may include La, Sc, Ca, Ba, Gd, Y, Sr or the like. Moreover, oxygen vacancies may be formed in the HZO. As another example, the ferroelectric material may include aluminum nitride (AlN) doped Sc (AlN:Sc).

In some embodiments, the channel material layer 116 includes a semiconductor material. The semiconductor material may be an oxide semiconductor material, a group IV semiconductor material or a group III-V semiconductor material. For instance, the oxide semiconductor material may include indium-gallium-zinc-oxide (IGZO), tin oxide ($SnO_x$), indium oxide ($InO_x$), gallium oxide (e.g., $Ga_2O_3$), zinc oxide (e.g., ZnO), magnesium oxide (e.g., MgO), gadolinium oxide (e.g., GdO) or in any binary-, ternary-, quaternary-combinations. Indium-zinc-oxide (InZnO) may be one of the binary combination examples. Tin-gallium-zinc-oxide (SnGaZnO) and tin-indium-zinc-oxide (SnInZnO) may be two of the ternary combination examples, and tin-indium-gallium-zinc-oxide (SnInGaZnO) may be one of the quaternary combination examples. On the other hand, the group IV semiconductor material may include Si and/or SiGe, and the group III-V semiconductor material may include GaN, GaAs or InGaAs. The channel material layer 116 may be formed to a suitable thickness by PECVD, PEALD, PVD, the like, or a combination thereof.

In some embodiments, the cap material layer 118 may be a low-k dielectric layer which has a dielectric constant less than 3.9. For example, the dielectric constant of the cap material layer 118 ranges from 2.6 to 3.8, such as 2.7, 2.8, 2.9, 3.0, 3.1, 3.2, 3.3, 3.4, 3.5, 3.6, or 3.7, including any range between any two of the preceding values. In some embodiments, the cap material layer 118 includes a porous dielectric material. In some embodiments, the cap material layer 118 includes elements such as Si, O, C, N and/or H. For example, the cap material layer 118 includes SiOCH, SiOC, SiOCN or a combination thereof. In some embodiments, the dielectric layer 106 includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. The cap material layer 118 may include one or more dielectric materials and/or one or more dielectric layers. The cap material layer 118 may be formed to a suitable thickness by PECVD, PEALD, spin coating, the like, or a combination thereof.

Referring to FIGS. 6A-7A and FIGS. 6B-7B, the cap material layer 118 and the channel material layer 116 is patterned to form a channel layer 126 (also referred to as active layer) and a cap layer 128 on the gate dielectric layer 108. In detail, a mask pattern may be formed on the cap material layer 118 and an etching process is then performed by using the mask pattern as mask to remove portions of the cap material layer 118 and the channel material layer 116 until exposing the top surface of the gate dielectric layer 114. In some embodiments, the etching process includes a dry etching process, such as a RIE process.

Figure 8A:
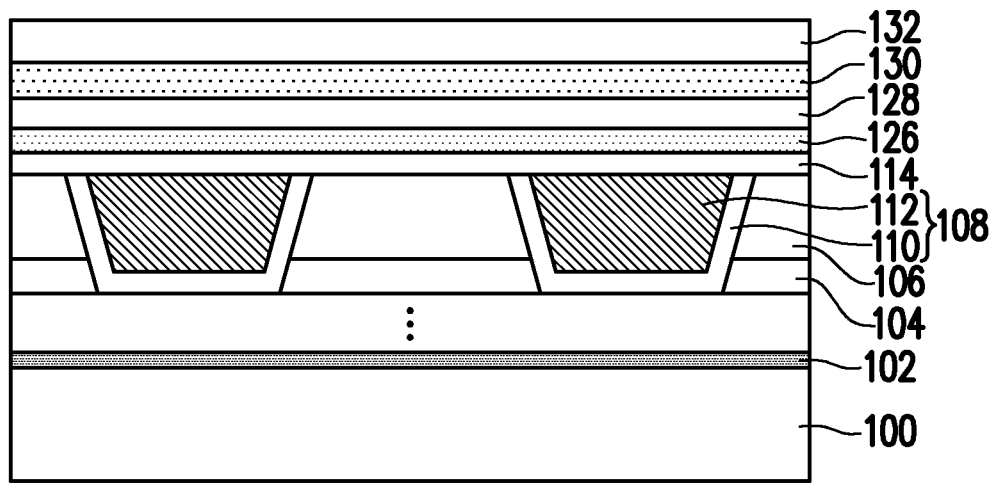
Figure 8B:
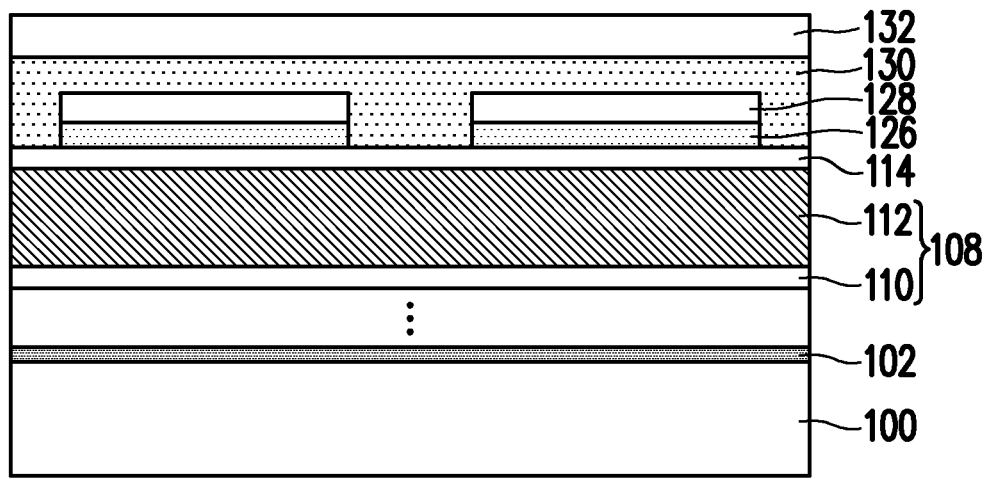

Referring to FIG. 8A and FIG. 8B, a blocking layer 130 is deposited on the gate dielectric layer 114 and the cap layer 128. In some embodiments, the blocking layer 130 completely covers surfaces of the channel layer 126 and the cap layer 128. That is, the blocking layer 130 may cover the sidewall of the channel layer 126, and the top surface and the sidewall of the cap layer 128. In some embodiments, the blocking layer 130 includes a high-k dielectric material which has a dielectric constant greater than 3.9 or greater than silicon oxide. The blocking layer 130 may include aluminum oxide, silicon oxide carbide, chromium oxide ($Cr_2O_3$), or a combination thereof. The blocking layer 130 may be formed to a suitable thickness by CVD, ALD, PVD, the like, or a combination thereof.

After forming the blocking layer 130, a dielectric layer 132 may be formed on the blocking layer 130. The dielectric layer 132 In some embodiments, the dielectric layer 132 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 132 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the dielectric layer 132 includes one or more dielectric materials. The dielectric layer 132 may be formed to a suitable thickness by PECVD, PEALD, spin coating, the like, or a combination thereof.

In the present embodiment, the material of the blocking layer 130 is different from the material of the cap layer 128 (also referred to as lower dielectric layer) and the dielectric layer 132 (also referred to as upper dielectric layer). More specifically, the blocking layer 130 has a dielectric constant greater than a dielectric constant of the cap layer 128 and the dielectric layer 132. For example, the blocking layer 130 is the aluminum oxide layer, and the cap layer 128 and the dielectric layer 132 are the silicon oxide layers.

Figure 9A:
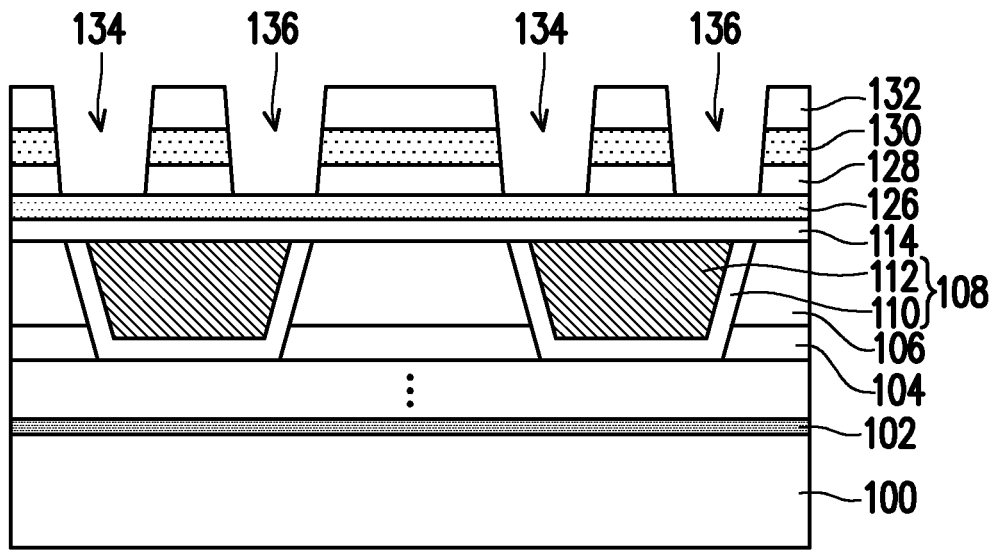
Figure 9B:
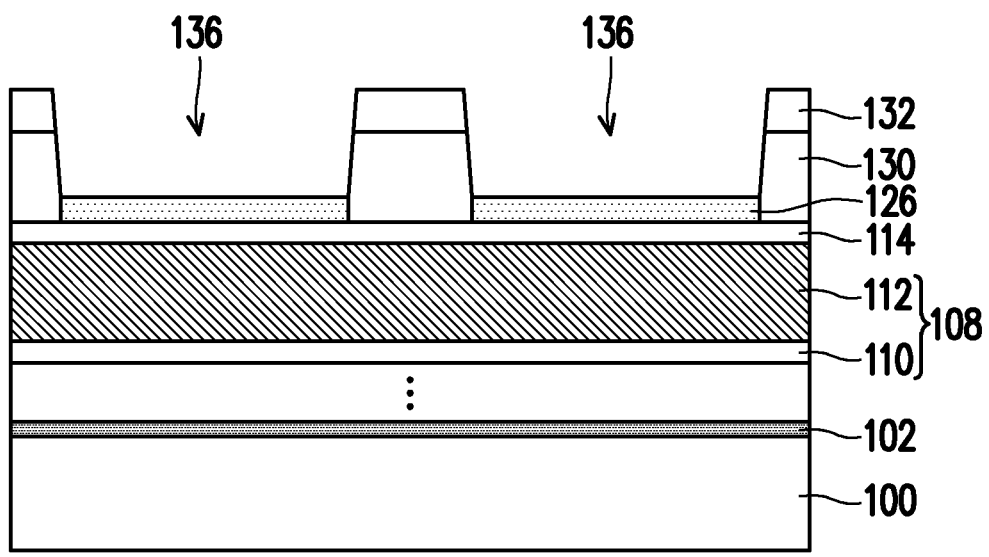
Figure 10A:
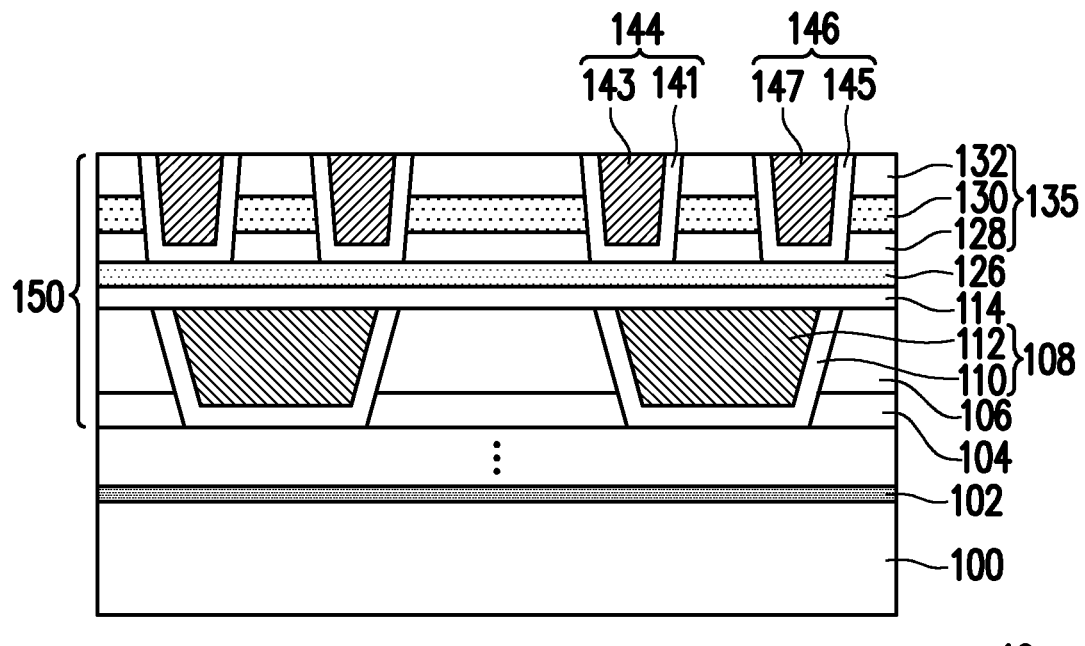

Referring to FIGS. 8A-9A and FIG. 8B-9B, a plurality of openings 134 and 136 are formed in the cap layer 128, the blocking layer 130, and the dielectric layer 132 to expose the top surface of the channel layer 126. In some embodiments, the openings 134 and 136 are formed by forming a mask pattern on the dielectric layer 132 and performing an etching process by using the mask pattern as mask to remove portions of the cap layer 128, the blocking layer 130, and the dielectric layer 132. In some embodiments, the etching process includes a dry etching process, such as a RIE process. It should be noted that since the material of the blocking layer 130 is different from the material of the cap layer 128 and the dielectric layer 132, the blocking layer 130 may be referred to as an etch stop layer during the said etching process. Specifically, the blocking layer 130 can prevent the openings 134 and 136 from over-etching the underlying channel layer 126. In such embodiment, the structure of the channel layer 126 would not be damaged to stabilize the physical or chemical properties of the channel layer 126, thereby maintaining the electrical performance and further improving the device reliability of the transistor structure 150 (FIG. 10A). Further, as shown in FIG. 9A, one of the openings 134 and 136 may have an inclined sidewall. However, the embodiments of the present disclosure are not limited thereto. In other embodiments, one of the openings 134 and 136 may have a straight sidewall, a stepped sidewall, or any shaped sidewall.

Referring to FIGS. 9A-10A and FIG. 9B-10B, a plurality of S/D features 144 are respectively formed in the openings 134, while a plurality of S/D features 146 are respectively formed in the openings 136. In detail, a metallic liner material may be formed to conformally cover the surface of the openings 134 and 136 and further extends to cover the top surface of the dielectric layer 132. Next, a metallic fill material may be formed on the metallic liner material and fills in the openings 134 and 136. Afterwards, a planarization process (e.g., CMP process) may be performed to remove excess portions of the metallic fill material and the metallic liner material on the top surface of the dielectric layer 132, thereby forming the S/D features 144 and 146 in the openings 134 and 136. In this case, the top surface of the dielectric layer 132 may be substantially level with the top surface of the S/D features 144 and 146. The metallic liner material and metallic fill material may be formed by suitable deposition process, such as a CVD process, a PVD process, an ALD process, an electroplating process, etc. Other suitable deposition processes are within the contemplated scope of disclosure.

In some embodiments, one S/D feature 144 may be referred to as a source electrode, while the other S/D feature 146 may be referred to as a drain electrode, and vice versa. The S/D feature 144 may include a metallic liner layer 141 and a metallic fill layer 143 on the metallic liner layer 141. The S/D feature 146 may include a metallic liner layer 145 and a metallic fill layer 147 on the metallic liner layer 145. The metallic liner layers 141 and 145 may include a conductive metallic nitride or a conductive metallic carbide such as TiN, TiN/W, Ti/Al/Ti, TaN, WN, TiC, TaC, and/or WC. The metallic fill layers 143 and 147 may include W, Cu, Al, Co, Ru, Mo, Ta, Ti, TiN, alloys thereof, and/or combinations thereof. Other suitable metallic liner and metallic fill materials within the contemplated scope of this disclosure may also be used.

Figure 10B:
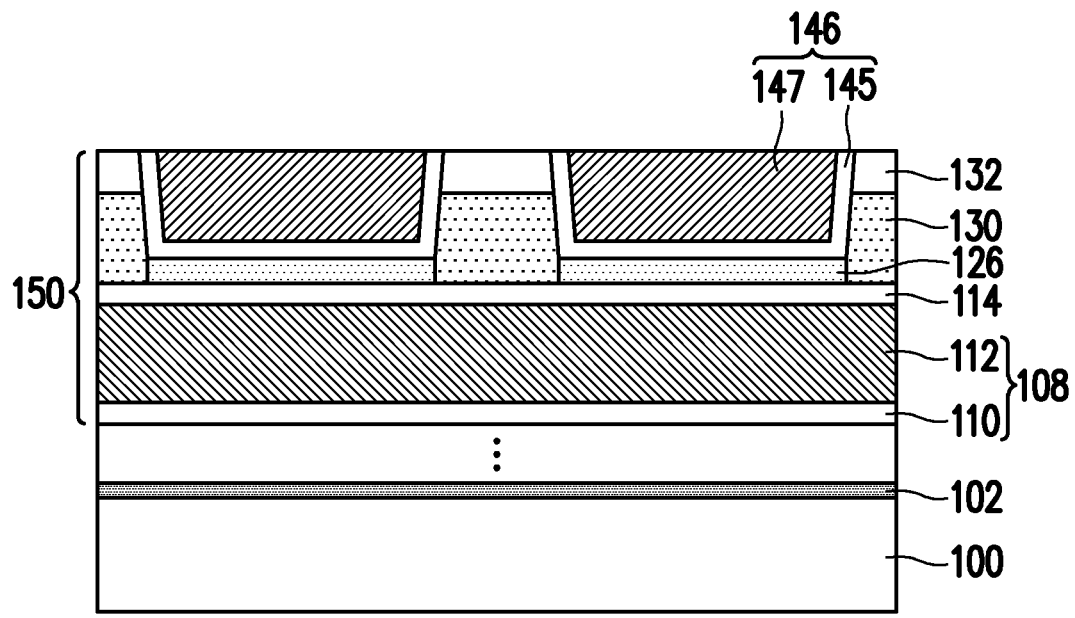

After forming the S/D features 144 and 146, a semiconductor device 10 with the transistor structure 150 is accomplished. The transistor structure 150 may be disposed on the substrate 100 and may be electrically connected to the device region 102 through the interconnect structure (shown as ellipsis). The transistor structure 150 further includes an isolation structure 135 on the channel layer 126 and laterally surrounding the pair of S/D features 144 and 146. In the cross-sectional view along the X direction, the isolation structure 135 may include the cap layer 128, the dielectric layer 132, and the blocking layer 130 vertically sandwiched between the cap layer 128 and the dielectric layer 132, as shown in FIG. 10A. In the cross-sectional view along the Y direction, the blocking layer 130 further extends to cover the sidewall of the channel layer 126 and is in physical contact with the top surface of the gate dielectric layer 114, as shown in FIG. 10B. It should be noted that, in the present embodiment, the blocking layer 130 can protect the surface (especially the sidewall) of the channel layer 126 from the diffusion of unwanted elements/molecules (e.g., O, N, H, $H_2O$, or the like) into the active layer 126 resulting from subsequent deposition or etching processes. The unwanted elements/molecules would change the carrier concentration of the channel layer 126, thereby affecting the electrical performance and device reliability. That is, in the present embodiment, the blocking layer 130 is able to stabilize the carrier concentration of the channel layer 126, thereby maintaining the electrical performance and further improving the device reliability of the transistor structure 150.

Figure 10C:
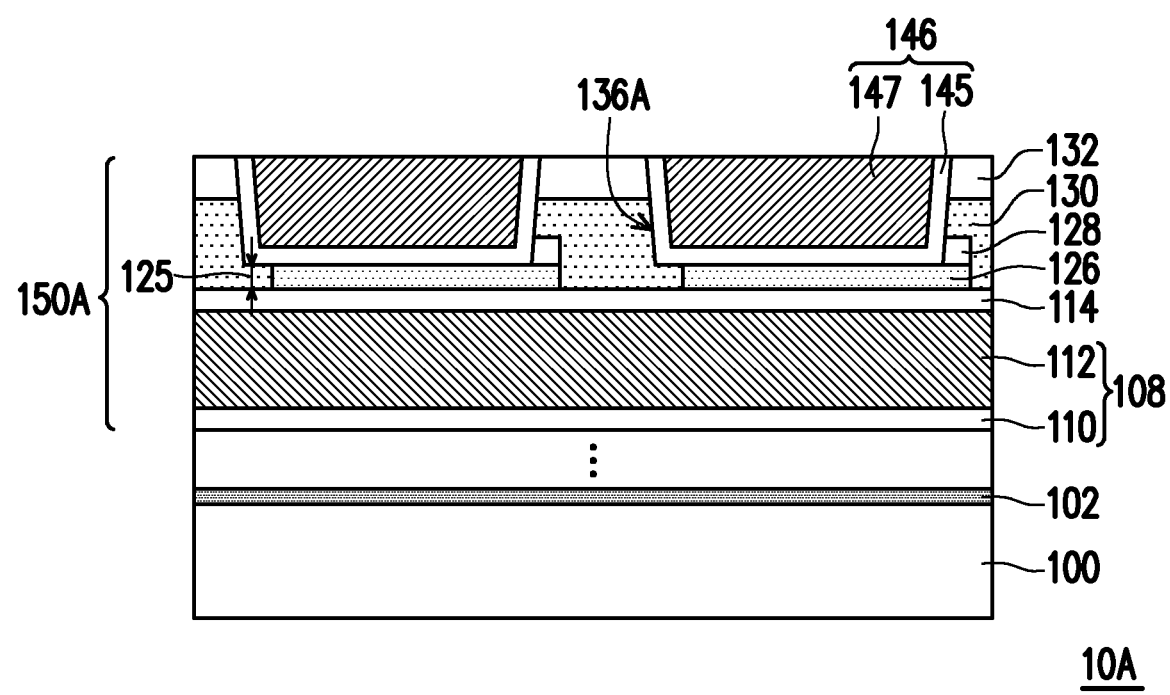
FIG. 10C is a cross-sectional view of a semiconductor device with the transistor structure in FIG. 1 taken along the line B-B in accordance with some alternative embodiments.

FIG. 10C is a cross-sectional view of a semiconductor device with the transistor structure in FIG. 1 taken along the line B-B in accordance with some alternative embodiments.

Referring to FIG. 10C, another semiconductor device 10A with a transistor structure 150A is provided. Basically, the configuration of the semiconductor device 10A may be similar to that of the semiconductor device 10 of FIG. 10B, and have been described in detail in the above paragraphs. The details are thus no repeated herein. FIG. 10C primarily illustrates that when the S/D features 146 are misaligned with the underlying channel layer 126, the blocking layer 130 can act as an etch stop layer to prevent from over-etching and damaging the underlying channel layer 126. In this case, there is a non-zero distance 125 between the bottom surface of the S/D feature 146 and the top surface of the gate dielectric layer 114. In some embodiments, the non-zero distance 125 may be substantially equal to or less than the thickness of the channel layer 126. In addition, the S/D features 146 may be not in direct contact with the top surface of the gate dielectric layer 114.

Figure 11:
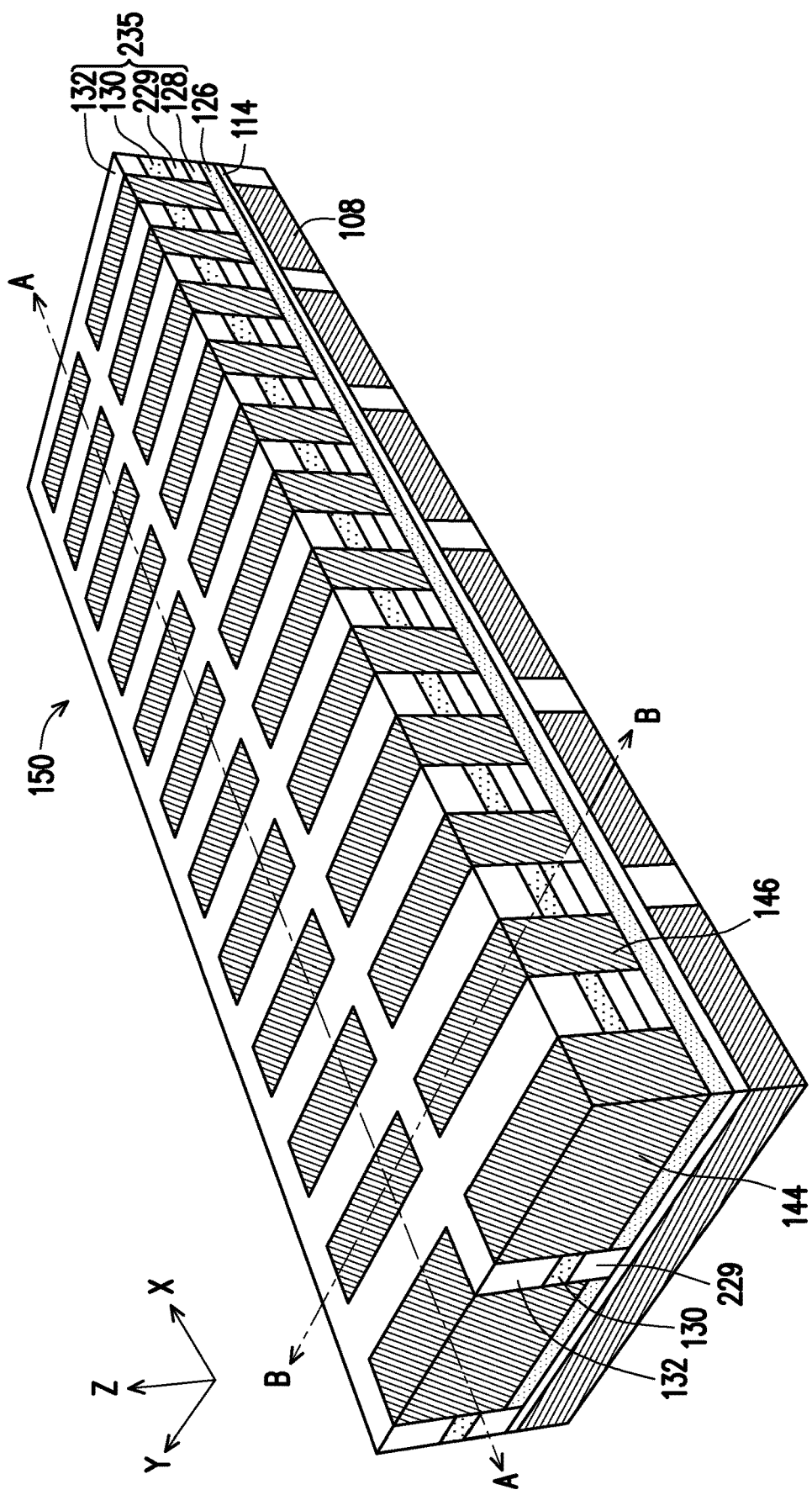
FIG. 11 is a perspective view showing a transistor structure in accordance with some embodiments.
Figure 12A:
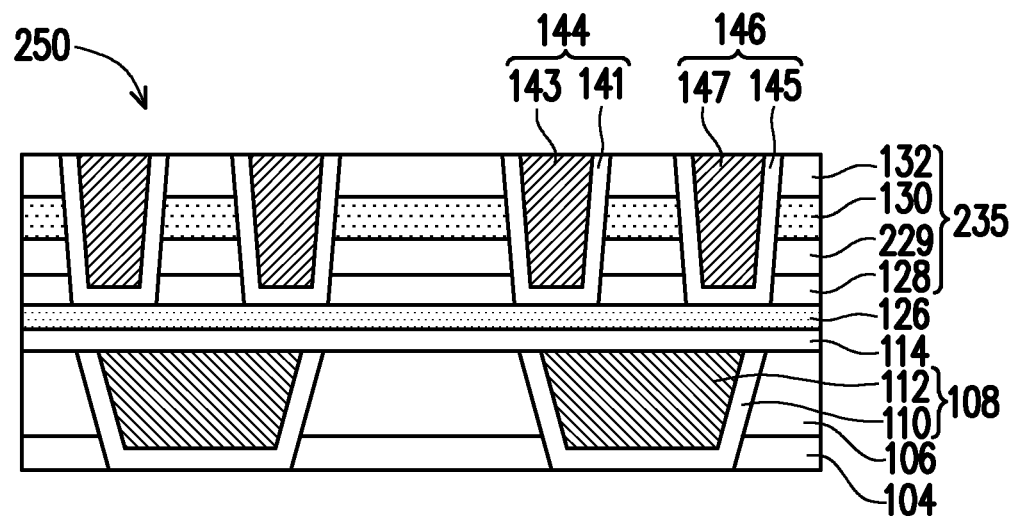
FIG. 12A is a cross-sectional view of a transistor structure in FIG. 11 taken along the line A-A in accordance with some embodiments.
Figure 12B:
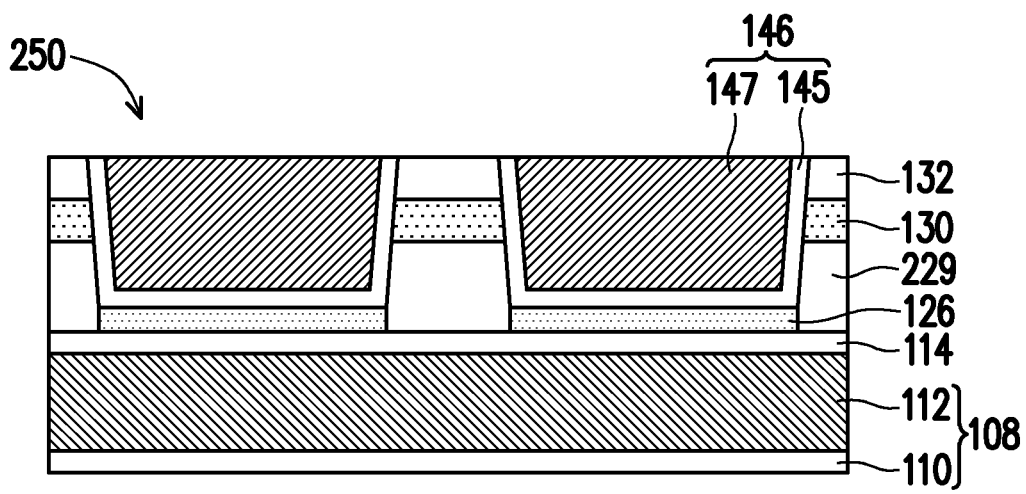
FIG. 12B is a cross-sectional view of a transistor structure in FIG. 11 taken along the line B-B in accordance with some embodiments.
Figure 13A:
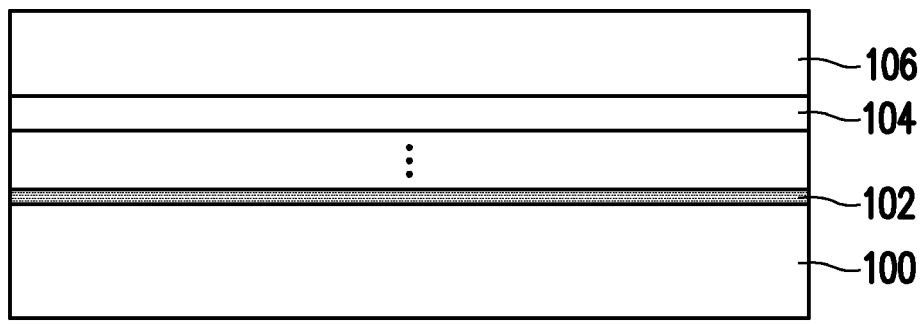
FIG. 13A, FIG. 14A, FIG. 15A, FIG. 16A, FIG. 17A, FIG. 18A, FIG. 19A, FIG. 20A, and FIG. 21A are cross-sectional views of forming a semiconductor device with the transistor structure in FIG. 11 taken along the line A-A in accordance with a second embodiment.
Figure 13B:
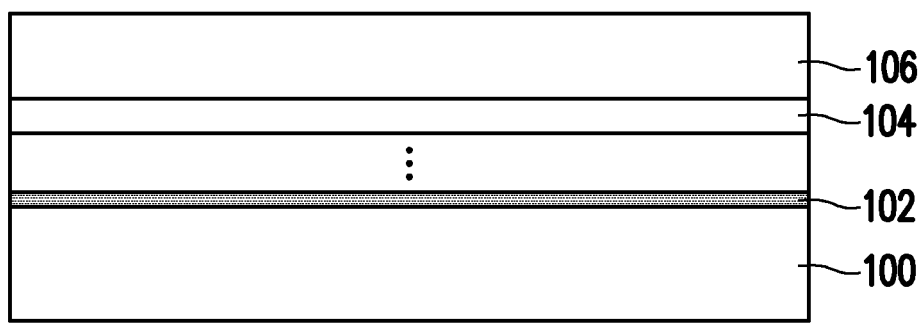
FIG. 13B, FIG. 14B, FIG. 15B, FIG. 16B, FIG. 17B, FIG. 18B, FIG. 19B, FIG. 20B, and FIG. 21B are cross-sectional views of forming a semiconductor device with the transistor structure in FIG. 11 taken along the line B-B in accordance with a second embodiment.
Figure 14A:
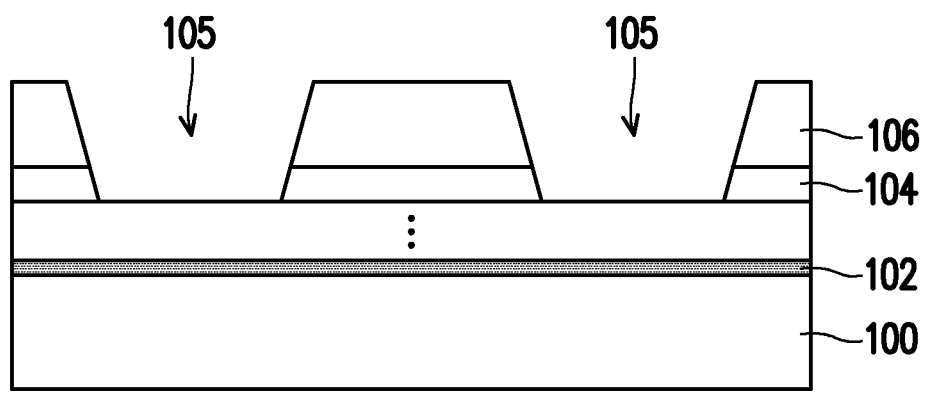
Figure 14B:
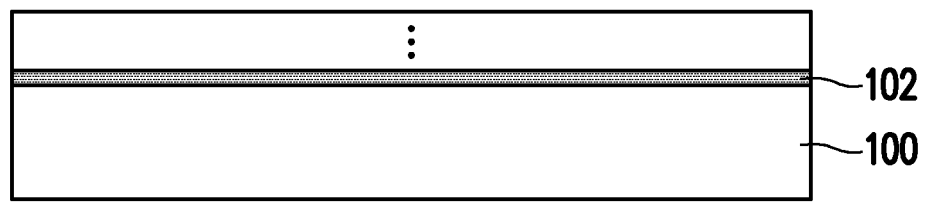
Figure 15A:
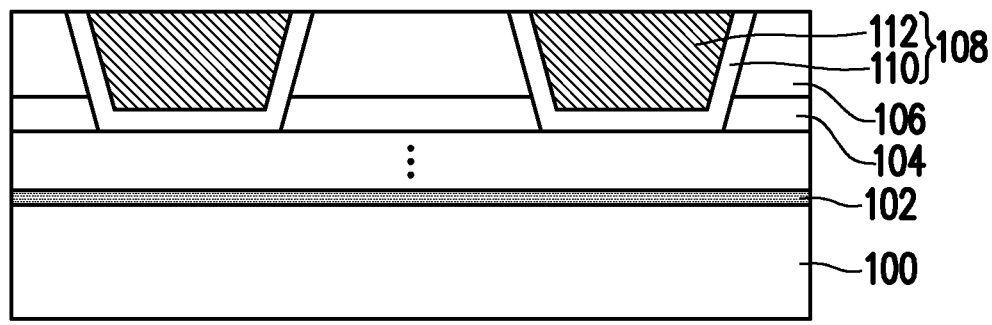
Figure 15B:
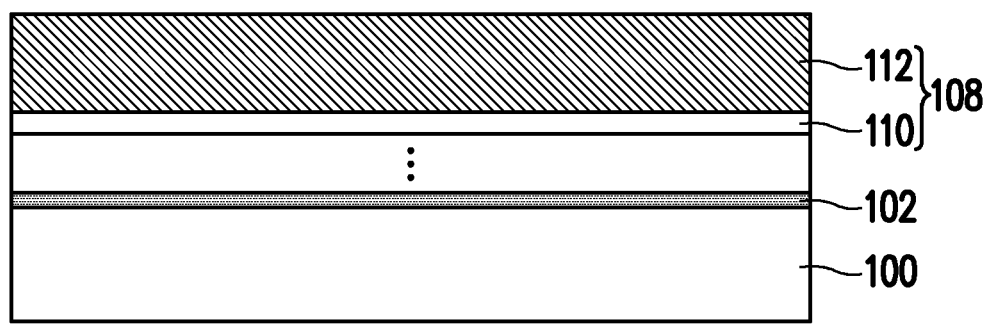
Figure 16A:
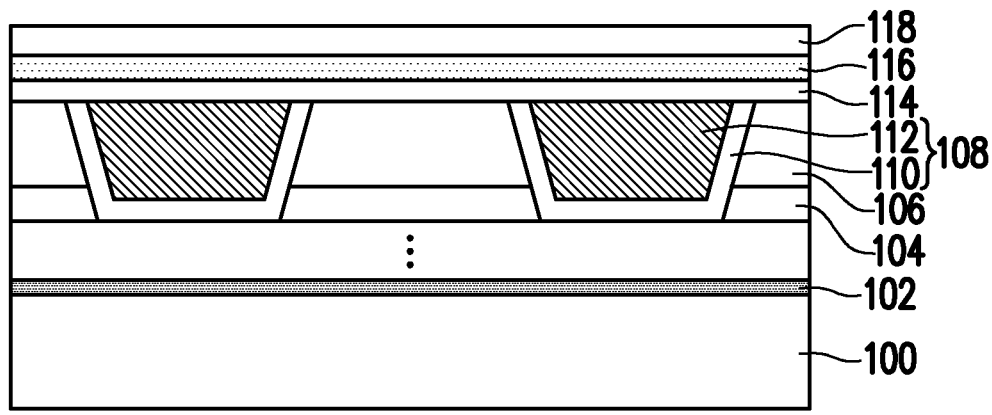
Figure 16B:
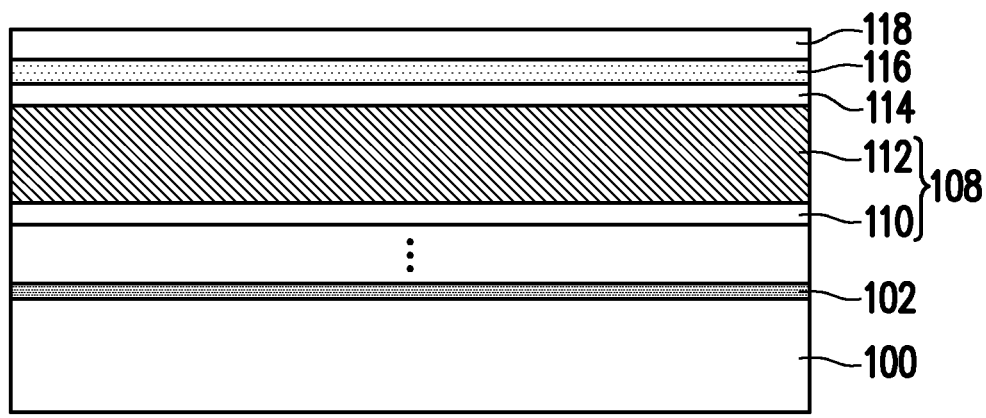
Figure 17A:
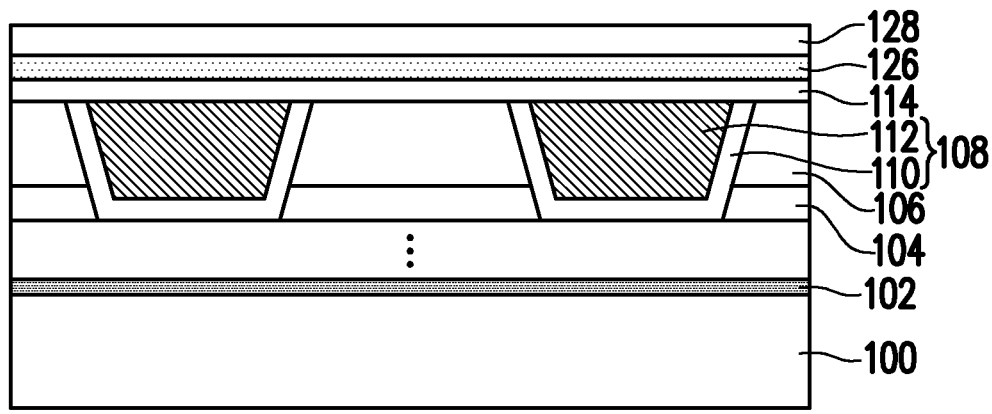
Figure 17B:
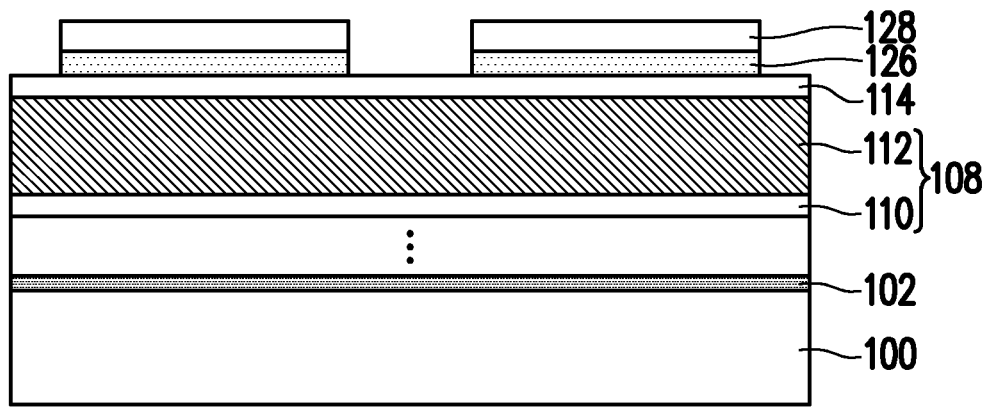

FIG. 11 is a perspective view showing a transistor structure in accordance with some embodiments. FIG. 12A is a cross-sectional view of a transistor structure in FIG. 11 taken along the line A-A in accordance with some embodiments. FIG. 12B is a cross-sectional view of a transistor structure in FIG. 11 taken along the line B-B in accordance with some embodiments.

Referring to FIG. 11, FIG. 12A, and FIG. 12B, a transistor structure 250 is provided.

Referring to FIG. 11, basically, the transistor structure 250 is similar to the transistor structure 150 of FIG. 1, that is, the structures, materials, and functions of the transistor structure 250 are similar to those of the transistor structure 150, and thus the details are omitted herein. The main difference between the transistor structure 250 and the transistor structure 150 lies in that the transistor structure 250 includes an isolation structure 235 having the configuration different form that of the isolation structure 135 of FIG. 1.

In detail, the isolation structure 235 may include from bottom to top a lower dielectric layer 128, a buffer layer 229, a blocking layer 130, and an upper dielectric layer 132. The isolation structure 235 may laterally surround the pair of S/D features 144 and 146. In some embodiments, the pair of S/D features 144 and 146 is embedded in the isolation structure 235. In the cross-sectional view along the X direction, the isolation structure 235 may include the lower dielectric layer 128, the buffer layer 229, the blocking layer 130, and the upper dielectric layer 132, as shown in FIG. 12A. In the cross-sectional view along the Y direction, the buffer layer 229 further extends to cover a sidewall of the active layer 126 and is in physical contact with a top surface of the gate dielectric layer 114, as shown in FIG. 12B. It should be noted that, in the present embodiment, the buffer layer 229 is selected with the low damage deposition process respective to the active layer 126. In this case, the buffer layer 229 may be in direct contact with the sidewall of the active layer 126 and stabilize the physical or chemical properties of the active layer 126, thereby maintaining the electrical performance and further improving the device reliability of the transistor structure 250. In addition, the blocking layer 130 also can prevent from the diffusion of unwanted elements/molecules (e.g., O, N, H, $H_2O$, or the like) into the active layer 126 resulting from subsequent deposition or etching processes.

FIG. 13A, FIG. 14A, FIG. 15A, FIG. 16A, FIG. 17A, FIG. 18A, FIG. 19A, FIG. 20A, and FIG. 21A are cross-sectional views of forming a semiconductor device with the transistor structure in FIG. 11 taken along the line A-A in accordance with a second embodiment. FIG. 13B, FIG. 14B, FIG. 15B, FIG. 16B, FIG. 17B, FIG. 18B, FIG. 19B, FIG. 20B, and FIG. 21B are cross-sectional views of forming a semiconductor device with the transistor structure in FIG. 11 taken along the line B-B in accordance with a second embodiment.

Figure 18A:
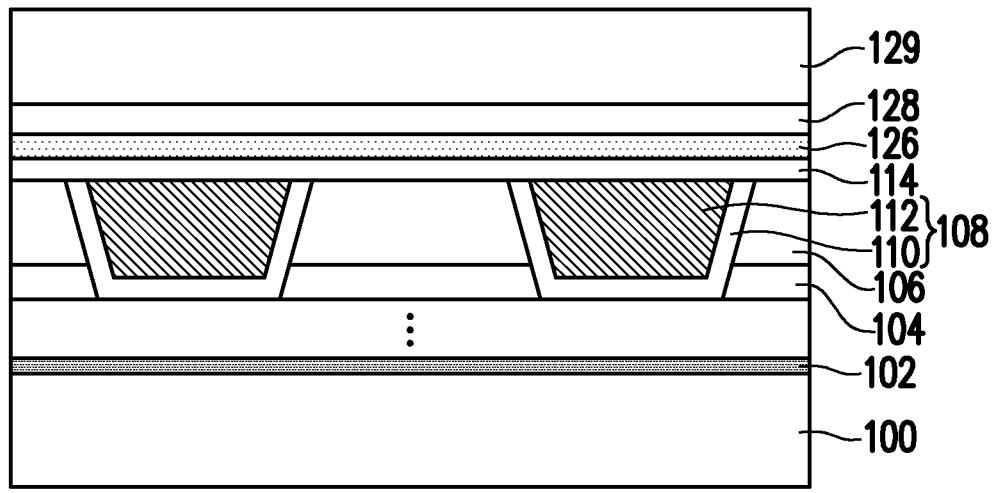
Figure 18B:
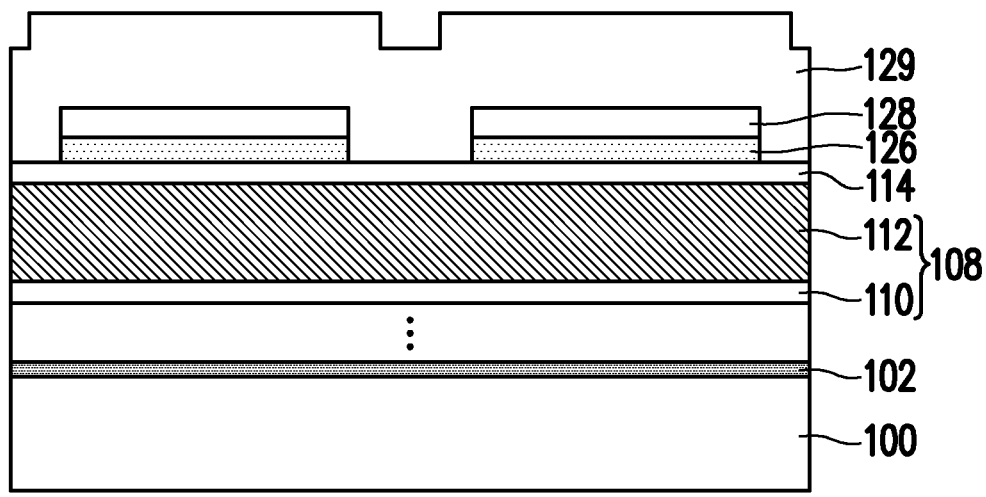

The steps of FIGS. 13A-17B are the same as the steps of FIGS. 3A-7B, and have been described in detail in the above paragraphs. The details are thus no repeated herein. Referring to FIG. 18A and FIG. 18B, a buffer material layer 129 is deposited to cover a sidewall of the channel layer 126 and a sidewall and a top surface of the cap layer 128. In some embodiments, the buffer material layer 129 may be a low-k dielectric layer which has a dielectric constant less than 3.9. For example, the dielectric constant of the buffer material layer 129 ranges from 2.6 to 3.8, such as 2.7, 2.8, 2.9, 3.0, 3.1, 3.2, 3.3, 3.4, 3.5, 3.6, or 3.7, including any range between any two of the preceding values. In some embodiments, the buffer material layer 129 includes a porous dielectric material. In some embodiments, the buffer material layer 129 includes elements such as Si, O, C, N and/or H. For example, the buffer material layer 129 includes SiOCH, SiOC, SiOCN or a combination thereof. In some embodiments, the buffer material layer 129 includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. The buffer material layer 129 may include one or more dielectric materials and/or one or more dielectric layers. The buffer material layer 129 may be formed to a suitable thickness by CVD, ALD, spin coating, the like, or a combination thereof.

Figure 20A:
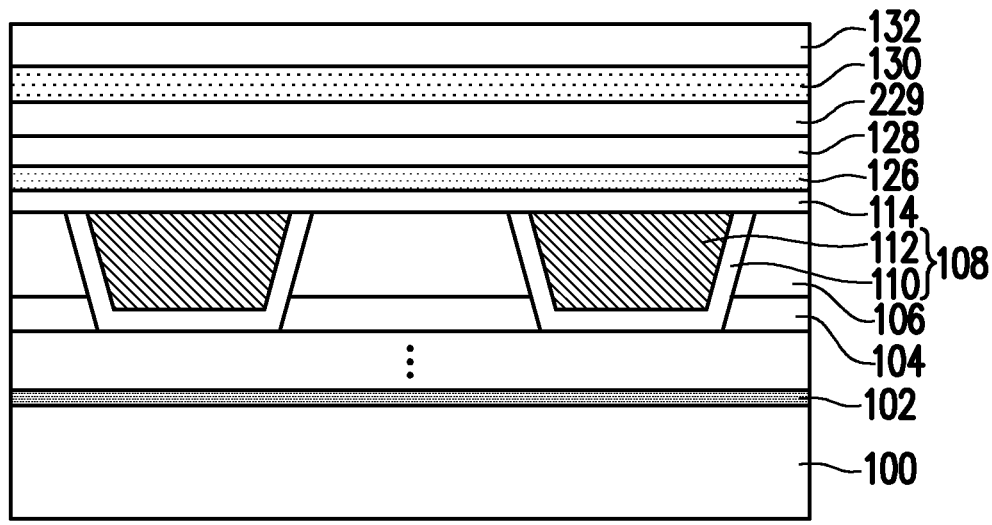

It should be noted that, in the present embodiment, the buffer material layer 129 is selected with the low damage deposition process respective to the active layer 126. In this case, a process power and a process temperature of the depositing the buffer material layer 129 are lower than a process power and a process temperature of the depositing to-be-formed blocking layer 130 (FIG. 20A). For example, when the buffer material layer 129 is deposited by using the ALD process, the ALD process may be performed at the process power (e.g., RF power) in a range of 200 W to 1200 W (e.g., 600 W), and the process temperature in a range of 200° C. to 400° C. (e.g., 300° C.). However, the embodiments of the present disclosure are not limited thereto, in other embodiments, the depositing the buffer material layer 129 may have other parameters to adjust.

Figure 19A:
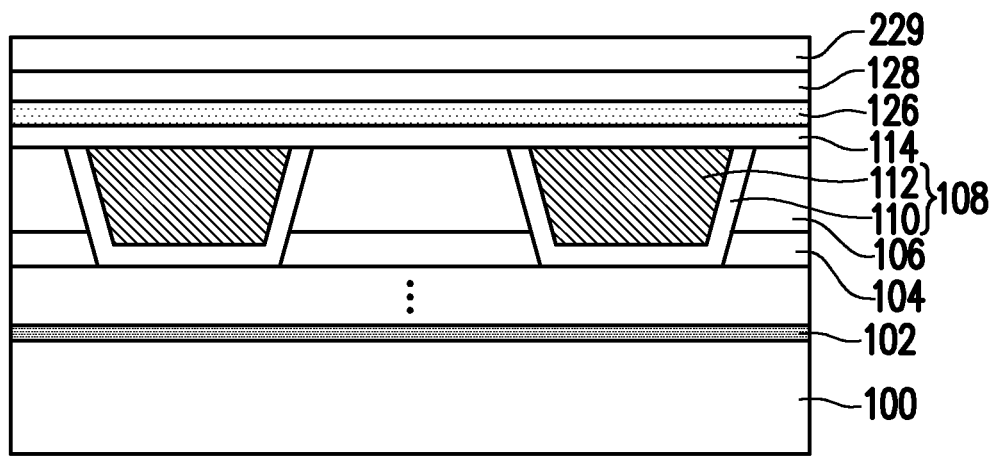
Figure 19B:
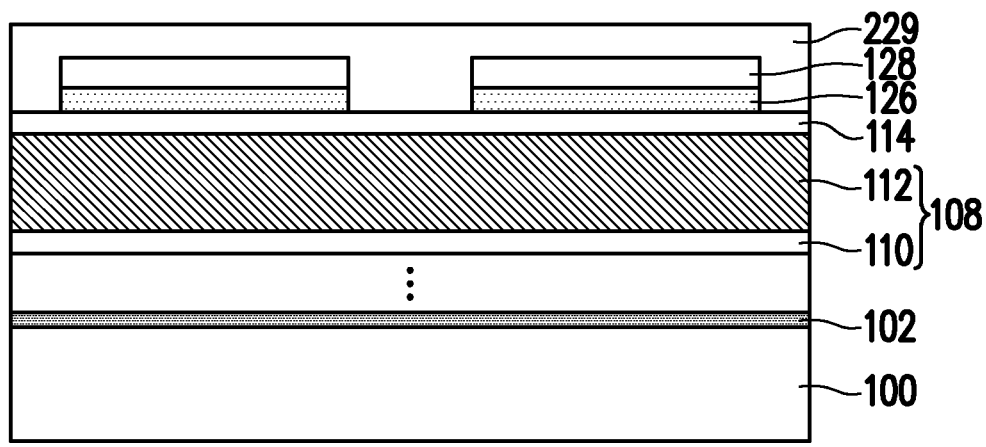

Referring to FIG. 19A and FIG. 19B, a planarization process (e.g., CMP process) is performed on the buffer material layer 129 to form a buffer layer 229. In some embodiments, the buffer layer 229 completely covers surfaces of the channel layer 126 and the cap layer 128. That is, the buffer layer 229 may cover the sidewall of the channel layer 126, and the top surface and the sidewall of the cap layer 128. In addition, after the planarization process, a top surface of the buffer layer 229 may be flatter than a top surface of the buffer material layer 129 (FIG. 18A). In other word, the top surface of the buffer layer 229 may be referred to a flat top surface.

Figure 20B:
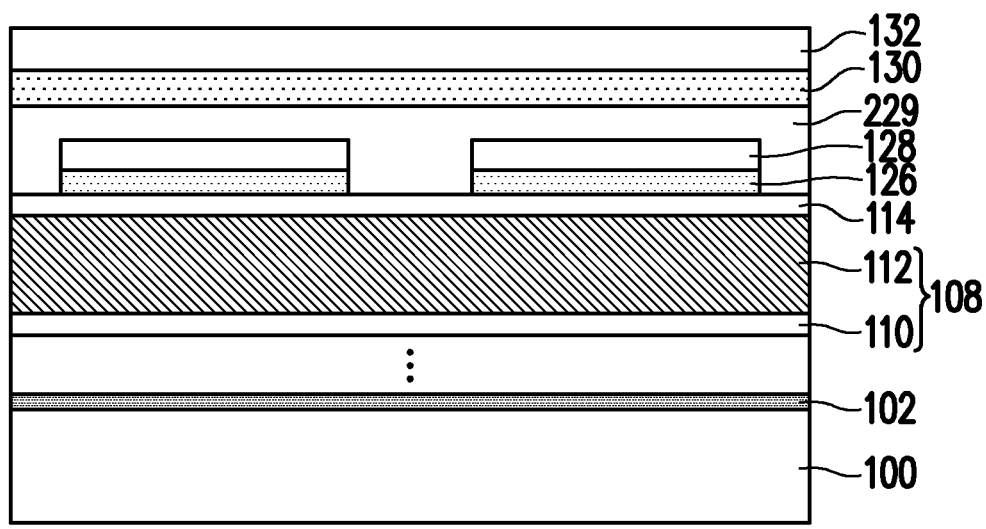

Referring to FIG. 20A and FIG. 20B, a blocking layer 130 is deposited on the buffer layer 229. In some embodiments, the blocking layer 130 includes a high-k dielectric material which has a dielectric constant greater than 3.9 or greater than silicon oxide. The blocking layer 130 may include aluminum oxide, silicon oxide carbide, chromium oxide ($Cr_2O_3$), or a combination thereof. The blocking layer 130 may be formed to a suitable thickness by CVD, ALD, PVD, the like, or a combination thereof.

After forming the blocking layer 130, a dielectric layer 132 may be formed on the blocking layer 130. The dielectric layer 132 In some embodiments, the dielectric layer 132 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 132 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the dielectric layer 132 includes one or more dielectric materials. The dielectric layer 132 may be formed to a suitable thickness by PECVD, PEALD, spin coating, the like, or a combination thereof.

In the present embodiment, the material of the blocking layer 130 is different from the material of the buffer layer 229, the cap layer 128, and the dielectric layer 132. More specifically, the blocking layer 130 has a dielectric constant greater than a dielectric constant of the buffer layer 229, the cap layer 128, and the dielectric layer 132. For example, the blocking layer 130 is the aluminum oxide layer, and the buffer layer 229, the cap layer 128, and the dielectric layer 132 are the silicon oxide layers. In some alternative embodiments, the buffer layer 229 and the cap layer 128 (or the dielectric layer 132) have different dielectric materials.

Referring to FIGS. 20A-21A and FIG. 20B-21B, a plurality of S/D features 144 and 146 are respectively formed in the openings (not shown) penetrating through the cap layer 128, the buffer layer 229, the blocking layer 130, and the dielectric layer 132. The steps of forming the S/D features 144 and 146 have been described in detail in the above paragraphs, thus the details are thus no repeated herein.

Figure 21A:
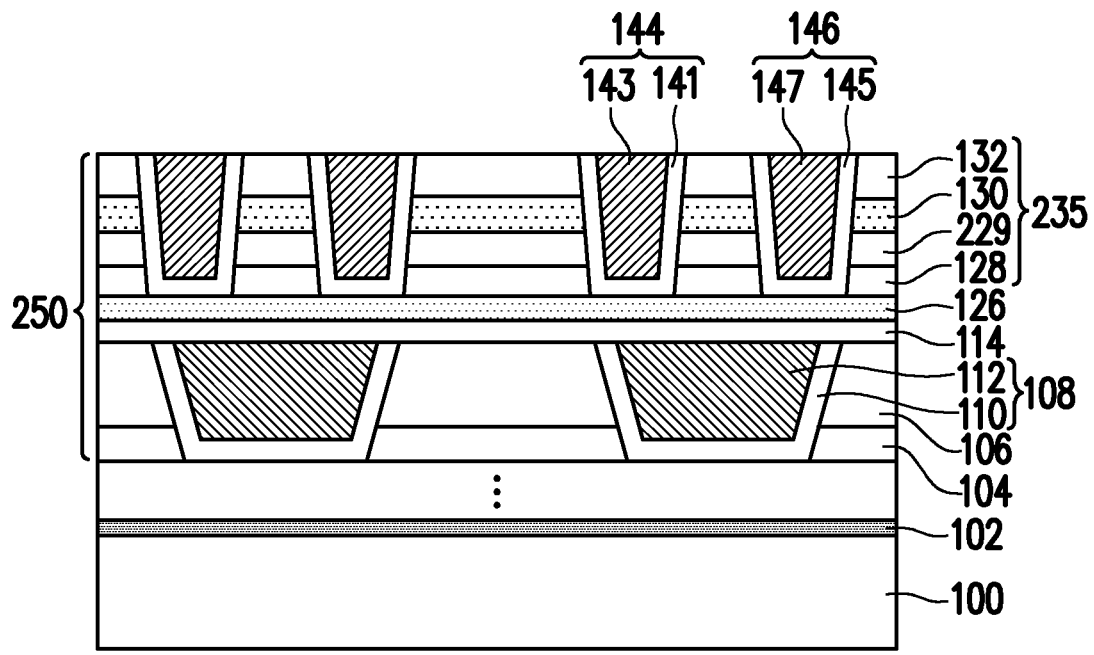
Figure 21B:
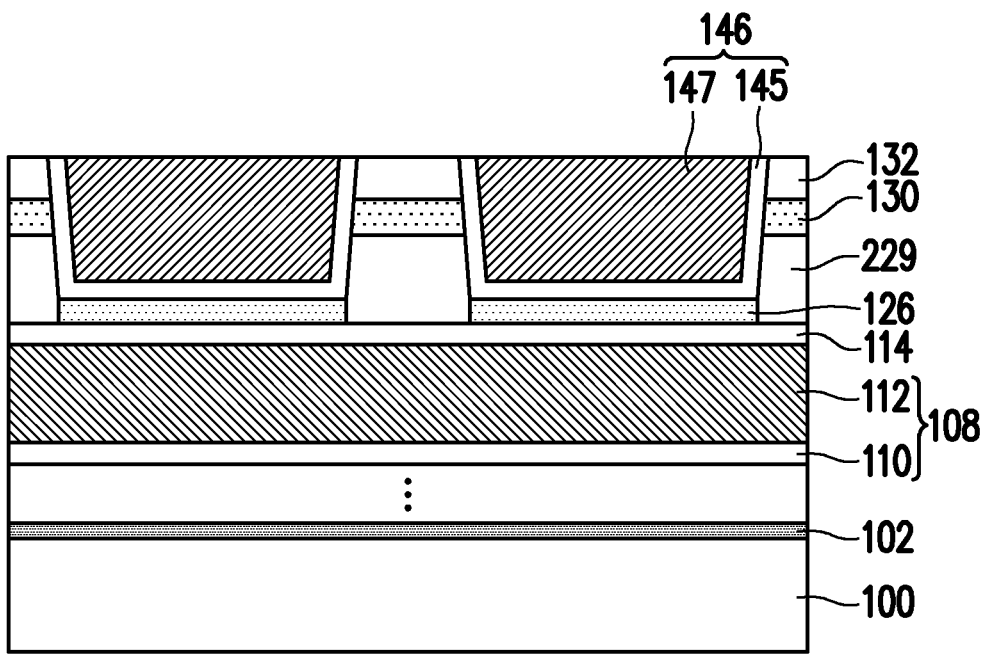

After forming the S/D features 144 and 146, a semiconductor device 20 with the transistor structure 250 is accomplished. The transistor structure 250 may be disposed on the substrate 100 and may be electrically connected to the device region 102 through the interconnect structure (shown as ellipsis). The transistor structure 250 further includes an isolation structure 235 on the channel layer 126 and laterally surrounding the pair of S/D features 144 and 146. In the cross-sectional view along the X direction, the isolation structure 235 may include the blocking layer 130 and the buffer layer 229 vertically sandwiched between the cap layer 128 and the dielectric layer 132, as shown in FIG. 21A. In the cross-sectional view along the Y direction, the buffer layer 229 further extends to cover the sidewall of the channel layer 126 and is in physical contact with the top surface of the gate dielectric layer 114, as shown in FIG. 21B.

It should be noted that, in the present embodiment, the buffer layer 229 is selected with the low damage deposition process respective to the channel layer 126. In this case, the buffer layer 229 may be in direct contact with the sidewall of the active layer 126 and stabilize the physical or chemical properties of the active layer 126, thereby maintaining the electrical performance and further improving the device reliability of the transistor structure 250. In addition, the blocking layer 130 also can prevent from the diffusion of unwanted elements/molecules (e.g., O, N, H, $H_2O$, or the like) into the active layer 126 resulting from subsequent deposition or etching processes. The unwanted elements/molecules would change the carrier concentration of the channel layer 126, thereby affecting the electrical performance and device reliability. That is, in the present embodiment, the blocking layer 130 also can stabilize the carrier concentration of the channel layer 126, thereby maintaining the electrical performance and further improving the device reliability of the transistor structure 250.

According to some embodiments, a transistor structure includes a gate electrode; a gate dielectric layer disposed on the gate electrode; an active layer disposed on the gate dielectric layer; a pair of source/drain (S/D) features disposed on the active layer; and an isolation structure laterally surrounding the pair of S/D features, wherein the isolation structure at least includes a blocking layer and an upper dielectric layer on the blocking layer.

According to some embodiments, a method of forming a transistor structure includes: forming a gate electrode in a first dielectric layer; sequentially forming a gate dielectric layer, a channel material layer, and a cap material layer on the gate electrode; patterning the cap material layer and the channel material layer to form a channel layer and a cap layer on the gate dielectric layer; depositing a blocking layer to completely cover surfaces of the channel layer and the cap layer; forming a second dielectric layer on the blocking layer; forming a pair of openings which penetrate through the second dielectric layer, the blocking layer, and the cap layer, wherein the pair of openings expose a top surface of the channel layer; and forming a pair of source/drain (S/D) features in the pair of openings.

According to some embodiments, a method of forming a transistor structure includes: forming a gate electrode in a first dielectric layer; sequentially forming a gate dielectric layer, a channel material layer, and a cap material layer on the gate electrode; patterning the cap material layer and the channel material layer to form a channel layer and a cap layer on the gate dielectric layer; forming a buffer layer to completely cover surfaces of the channel layer and the cap layer; sequentially depositing a blocking layer and a second dielectric layer on the buffer layer; forming a pair of openings which penetrate through the second dielectric layer, the blocking layer, the buffer layer, and the cap layer, wherein the pair of openings expose a top surface of the channel layer; and forming a pair of source/drain (S/D) features in the pair of openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor structure, comprising:
   a gate electrode;
   a gate dielectric layer, disposed on the gate electrode;
   an active layer, disposed on the gate dielectric layer;
   a pair of source/drain (S/D) features, disposed on the active layer; and
   an isolation structure, laterally surrounding the pair of S/D features, wherein the isolation structure at least comprises a blocking layer and an upper dielectric layer on the blocking layer.

2. The transistor structure of claim 1, wherein the blocking layer further extends to cover a sidewall of the active layer and is in physical contact with a top surface of the gate dielectric layer in a cross-sectional view along a first direction.

3. The transistor structure of claim 2, wherein the isolation structure further comprises a lower dielectric layer disposed between the pair of S/D features so that the blocking layer is vertically sandwiched between the lower dielectric layer and the upper dielectric layer in a cross-sectional view along a second direction different from the first direction.

4. The transistor structure of claim 3, wherein the blocking layer has a dielectric constant greater than a dielectric constant of the upper and lower dielectric layers.

5. The transistor structure of claim 1, wherein the isolation structure further comprises a buffer layer extending to cover a sidewall of the active layer and in physical contact with a top surface of the gate dielectric layer in a cross-sectional view along a first direction,
wherein the blocking layer is vertically sandwiched between the lower dielectric layer and the buffer layer.

6. The transistor structure of claim 5, wherein the isolation structure further comprises a lower dielectric layer disposed between the pair of S/D features so that the blocking layer and the buffer layer are vertically sandwiched between the lower dielectric layer and the upper dielectric layer in a cross-sectional view along a second direction different from the first direction.

7. The transistor structure of claim 5, wherein the blocking layer has a dielectric constant greater than a dielectric constant of the buffer layer.

8. The transistor structure of claim 1, wherein a material of the blocking layer comprises aluminum oxide, silicon oxide carbide, chromium oxide ($Cr_2O_3$), or a combination thereof.

9. A method of forming a transistor structure, comprising:
forming a gate electrode in a first dielectric layer;
sequentially forming a gate dielectric layer, a channel material layer, and a cap material layer on the gate electrode;
patterning the cap material layer and the channel material layer to form a channel layer and a cap layer on the gate dielectric layer;
depositing a blocking layer to completely cover surfaces of the channel layer and the cap layer;
forming a second dielectric layer on the blocking layer;
forming a pair of openings which penetrate through the second dielectric layer, the blocking layer, and the cap layer, wherein the pair of openings expose a top surface of the channel layer; and
forming a pair of source/drain (S/D) features in the pair of openings.

10. The method of claim 9, wherein the blocking layer further extends to cover a sidewall of the channel layer and is in physical contact with a top surface of the gate dielectric layer in a cross-sectional view along a first direction.

11. The method of claim 10, wherein the cap layer is formed between the pair of S/D features, and the blocking layer is vertically sandwiched between the cap layer and the second dielectric layer in a cross-sectional view along a second direction different from the first direction.

12. The method of claim 9, wherein the blocking layer has a dielectric constant greater than a dielectric constant of the cap layer and the second dielectric layer.

13. The method of claim 9, wherein a material of the blocking layer comprises aluminum oxide, silicon oxide carbide, chromium oxide ($Cr_2O_3$), or a combination thereof.

14. The method of claim 9, wherein a material of the channel layer comprises an oxide semiconductor material, a group IV semiconductor material, or a group III-V semiconductor material.

15. A method of forming a transistor structure, comprising:
forming a gate electrode in a first dielectric layer;
sequentially forming a gate dielectric layer, a channel material layer, and a cap material layer on the gate electrode;
patterning the cap material layer and the channel material layer to form a channel layer and a cap layer on the gate dielectric layer;
forming a buffer layer to completely cover surfaces of the channel layer and the cap layer;
sequentially depositing a blocking layer and a second dielectric layer on the buffer layer;
forming a pair of openings which penetrate through the second dielectric layer, the blocking layer, the buffer layer, and the cap layer, wherein the pair of openings expose a top surface of the channel layer; and
forming a pair of source/drain (S/D) features in the pair of openings.

16. The method of claim 15, wherein the buffer layer further extends to cover a sidewall of the channel layer and is in physical contact with a top surface of the gate dielectric layer in a cross-sectional view along a first direction.

17. The method of claim 16, wherein the cap layer is formed between the pair of S/D features, and the blocking and the buffer layers are vertically sandwiched between the cap layer and the second dielectric layer in a cross-sectional view along a second direction different from the first direction.

18. The method of claim 15, wherein the forming the buffer layer comprises:
depositing a buffer material layer to cover a sidewall of the channel layer and a sidewall and a top surface of the cap layer; and
performing a planarization process on the buffer material layer, so that a top surface of the buffer layer is flatter than a top surface of the buffer material layer.

19. The method of claim 15, wherein a process power and a process temperature of the depositing the buffer material layer are lower than a process power and a process temperature of the depositing the blocking layer.

20. The method of claim 15, wherein the blocking layer has a dielectric constant greater than a dielectric constant of the cap layer and the second dielectric layer.

* * * * *